(12) United States Patent
Tang et al.

(10) Patent No.: US 9,842,023 B2
(45) Date of Patent: Dec. 12, 2017

(54) GENERATING SOFT READ VALUES USING MULTIPLE READS AND/OR BINS

(71) Applicant: SK hynix memory solutions inc., San Jose, CA (US)

(72) Inventors: Xiangyu Tang, San Jose, CA (US); Frederick K. H. Lee, Mountain View, CA (US); Jason Bellorado, San Jose, CA (US); Arunkumar Subramanian, Santa Clara, CA (US); Lingqi Zeng, Turlock, CA (US)

(73) Assignee: SK Hynix Memory Solutions Inc., San Jose, CA (US)

( * ) Notice: Subject to any disclaimer, the term of this patent is extended or adjusted under 35 U.S.C. 154(b) by 133 days.

(21) Appl. No.: 15/007,996

(22) Filed: Jan. 27, 2016

(65) Prior Publication Data

US 2016/0139987 A1    May 19, 2016

Related U.S. Application Data

(62) Division of application No. 13/747,329, filed on Jan. 22, 2013, now Pat. No. 9,269,448.

(60) Provisional application No. 61/591,639, filed on Jan. 27, 2012, provisional application No. 61/618,414, filed on Mar. 30, 2012.

(51) Int. Cl.
| | |
|---|---|
| *G11C 16/34* | (2006.01) |
| *G06F 11/10* | (2006.01) |
| *G11C 16/26* | (2006.01) |
| *G11C 29/52* | (2006.01) |
| *H03M 13/11* | (2006.01) |

(52) U.S. Cl.
CPC ...... *G06F 11/1068* (2013.01); *G06F 11/1048* (2013.01); *G06F 11/1072* (2013.01); *G11C 16/26* (2013.01); *G11C 16/34* (2013.01); *G11C 16/349* (2013.01); *G11C 16/3431* (2013.01); *G11C 29/52* (2013.01); *H03M 13/1102* (2013.01)

(58) Field of Classification Search
None
See application file for complete search history.

(56) References Cited

U.S. PATENT DOCUMENTS

| | | | |
|---|---|---|---|
| 8,243,514 B2 * | 8/2012 | Kang | G11C 11/5642 365/185.03 |
| 8,358,542 B2 * | 1/2013 | Radke | G11C 11/5642 365/185.03 |

(Continued)

FOREIGN PATENT DOCUMENTS

| | | |
|---|---|---|
| CN | 101601094 | 12/2009 |
| WO | WO 2009/072104 | 6/2009 |

OTHER PUBLICATIONS

Office Action issued by the State Intellectual Property Office dated Apr. 1, 2016, application No. 201380004523.7.

*Primary Examiner* — Son Mai
(74) *Attorney, Agent, or Firm* — IP & T Group LLP

(57) ABSTRACT

A starting read threshold is received. A first offset and a second offset is determined. A first read is performed at the starting read threshold offset by the first offset to obtain a first hard read value and a second read is performed at the starting read threshold offset by the second offset to obtain a second hard read value. A soft read value is generated based at least in part on the first hard read value and the second hard read value.

10 Claims, 12 Drawing Sheets

(56) References Cited

U.S. PATENT DOCUMENTS

| | | | | |
|---|---|---|---|---|
| 8,392,809 B1* | 3/2013 | Varnica | ................ | H03M 13/09 |
| | | | | 365/185.03 |
| 8,498,152 B2* | 7/2013 | Alrod | ................ | G06F 11/1072 |
| | | | | 365/185.01 |
| 8,773,905 B1* | 7/2014 | Radinski | ................ | G11C 16/26 |
| | | | | 365/185.03 |
| 8,923,062 B1* | 12/2014 | Lee | ................ | G11C 16/10 |
| | | | | 365/174 |
| 9,390,002 B1* | 7/2016 | Lee | ................ | G06F 12/0207 |
| 9,558,816 B2* | 1/2017 | Han | ................ | G11C 16/26 |
| 2011/0317488 A1 | 12/2011 | Tseng et al. | | |
| 2013/0176775 A1* | 7/2013 | Tang | ................ | G11C 16/26 |
| | | | | 365/185.2 |
| 2013/0258738 A1* | 10/2013 | Barkon | ................ | G11C 11/5642 |
| | | | | 365/45 |
| 2014/0185386 A1* | 7/2014 | Yang | ................ | G06F 11/1048 |
| | | | | 365/185.21 |

* cited by examiner

|  | New Storage | Somewhat Aged Storage | Old Storage | Very Old Storage |
|---|---|---|---|---|
| New Data | $x_{no\ leakage}$ | $x_{no\ leakage}$ | $x_{no\ leakage}$ | $x_{min\ leakage}$ |
| Somewhat Aged Data | $x_{no\ leakage}$ | $x_{min\ leakage}$ | $x_{min\ leakage}$ | $x_{mod\ leakage}$ |
| Old Data | $x_{no\ leakage}$ | $x_{min\ leakage}$ | $x_{mod\ leakage}$ | $x_{mod\ leakage}$ |
| Very Old Data | $x_{min\ leakage}$ | $x_{mod\ leakage}$ | $x_{mod\ leakage}$ | $x_{max\ leakage}$ |

500

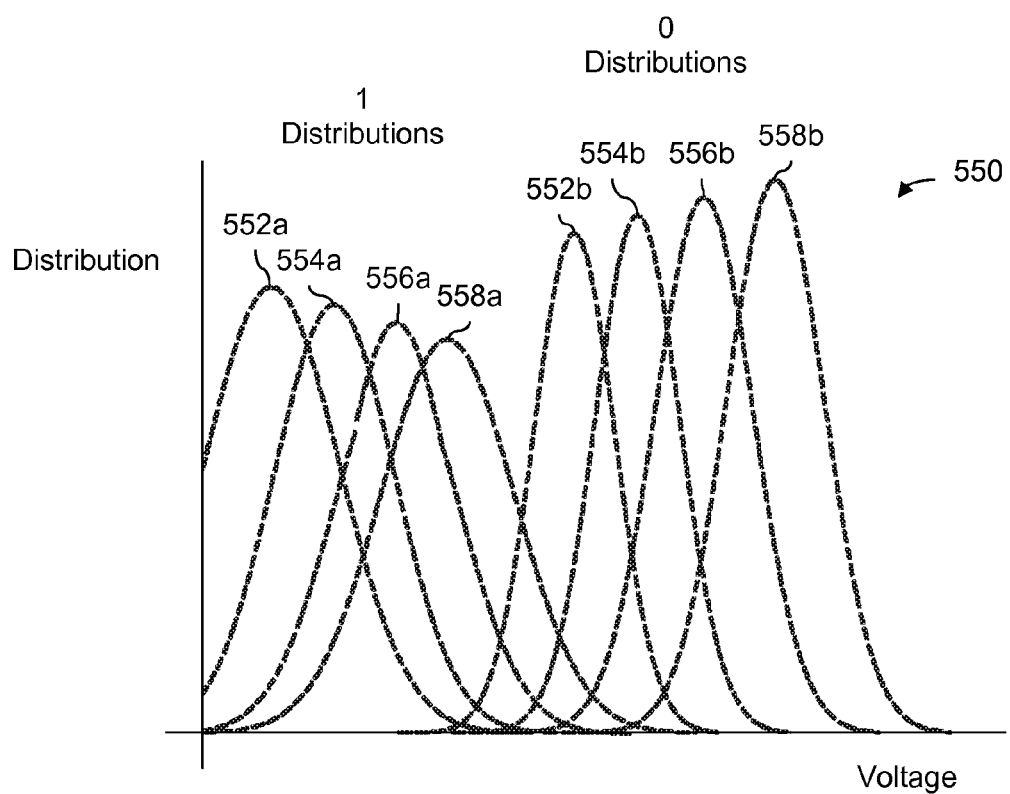

FIG. 5

GENERATING SOFT READ VALUES USING MULTIPLE READS AND/OR BINS

CROSS REFERENCE TO OTHER APPLICATIONS

This application is a division of U.S. patent application Ser. No. 13/747,329 filed on Jan. 22, 2013, which claims priority to U.S. Provisional Patent Application No. 61/591,639 entitled LDPC PERFORMANCE AND INCREASE READ THROUGHPUT IN NAND FLASH MEMORY filed Jan. 27, 2012 which is incorporated herein by reference for all purposes and this application claims priority to U.S. Provisional Patent Application No. 61/618,414 entitled METHOD FOR UPDATING LOG-LIKELIHOOD RATIOS (LLRs) FOR HARD-READ NAND DEVICES filed Mar. 30, 2012. The disclosures of each of the foregoing applications both of which is are incorporated herein by reference for all purposes.

BACKGROUND OF THE INVENTION

Currently, solid state storage systems do not natively return soft information when reading stored information. In one example, NAND Flash systems return either a 1 or 0 (i.e., hard read values) when a cell is read using a particular read threshold. Some NAND Flash systems synthesize soft information from the returned hard read values so that soft input decoders (such as soft input low-density parity-check (LDPC) decoders) can be used in the storage system. New techniques for generating soft read values would be desirable, for example so that higher quality soft read values are obtained, decoding by a soft input error correction decoder faster, and/or less storage is required.

BRIEF DESCRIPTION OF THE DRAWINGS

Various embodiments of the invention are disclosed in the following detailed description and the accompanying drawings.

FIG. 5 is a diagram showing an embodiment of an offset which is selected based at least in part on the age of data and the age of storage.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
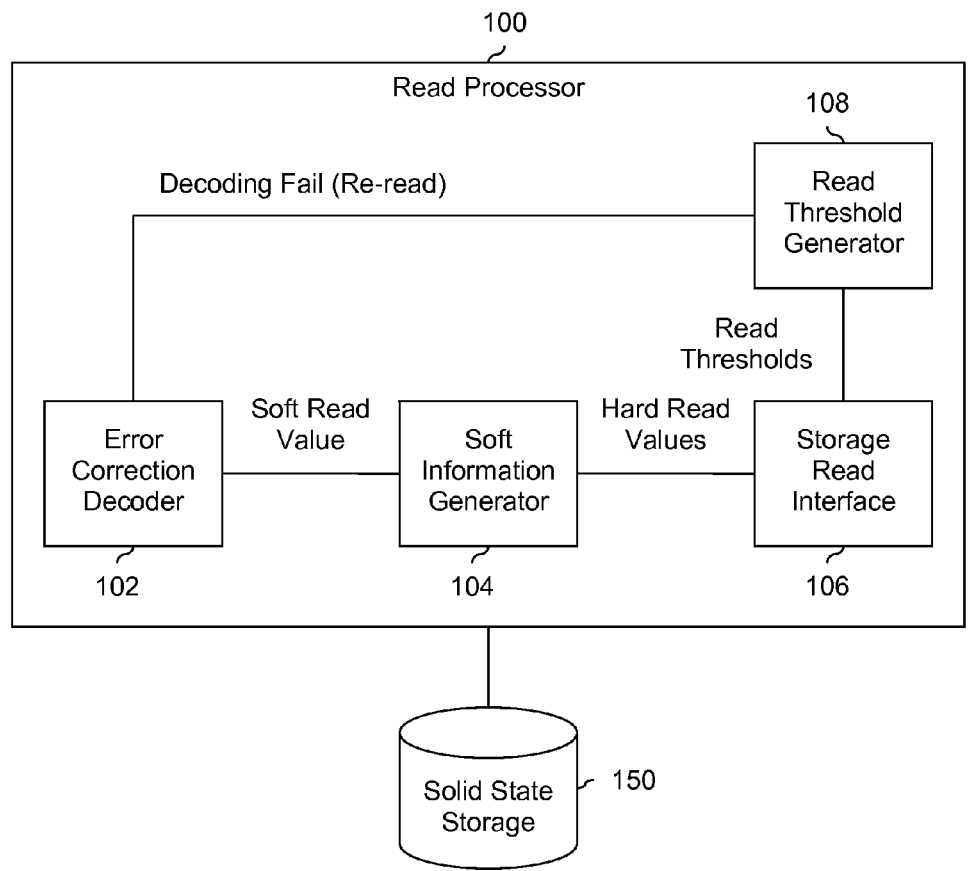
FIG. 1 is a diagram showing an embodiment of a read processor associated with a solid state storage system.

FIG. 1 is a diagram showing an embodiment of a read processor associated with a solid state storage system. In the example shown, read processor 100 reads information stored in solid state storage 150. To more clearly illustrate the read related techniques which are described herein, FIG. 1 does not show some components a typical storage system includes, such as a write processor. However, storage systems which perform the techniques described herein do not necessarily exclude such components. In some embodiments, read processor 100 includes or is implemented as a semiconductor device, such as an application-specific integrated circuit (ASIC) or a field-programmable gate array (FPGA). In some embodiments, solid state storage 150 includes NAND Flash memory.

Read threshold generator 108 generates read thresholds which are passed to storage read interface 106. Any appropriate technique may be used for determining or generating a (e.g., first, second, and so on) read threshold. For example, in one technique where a soft read value is generated using both a first and a second read, a first and a second read threshold are passed from read threshold generator 108 to storage read interface 106. Some examples of this are described in further detail below. In some embodiments, read threshold generator 108 waits to analyze information from the first read before generating the second read threshold.

Storage read interface 106 uses the read threshold to read one or more cells (e.g., a page) in solid state storage 150. Depending upon the voltage stored in a given cell and the specified read threshold, a hard read value is output by storage read interface 106. In one example, solid state storage 150 includes single level cells (SLC) where each cell stores a single bit. In one bit mapping, if the SLC cell has a voltage that is below the read threshold, storage read interface 106 outputs a hard read value of 1; if the SLC cell has a voltage that is above the read threshold, storage read interface 106 outputs a hard read value of 0.

Hard read values are passed from storage read interface 106 to soft information generator 104 which generates soft read values. In some embodiments, soft information generator 104 generates a soft read value for a cell using two reads of the cell. In some embodiments, a soft read value is a log-likelihood ratio (LLR) where the sign (e.g., + or −) indicates a decision or a hard read value (e.g., 0 or 1; 11, 10, 01, or 00; and so on) and the magnitude indicates a certainty or likelihood in that decision (e.g., a greater magnitude corresponds to a greater certainty in an associated decision). Although some LLR examples may be described herein, the techniques described herein are not necessarily limited to LLR embodiments.

Soft read values are passed from soft information generator 104 to error correction decoder 102. Error correction decoder 102 is configured to input soft information and in one example is a soft input low-density parity-check (LDPC) decoder. For example, at a first iteration, soft information generator 104 may pass LLR values for each cell in a page to error correction decoder 102 where a codeword fits in a page. In some embodiments, a codeword may be only a portion of a page. Error correction decoder 102 performs error correction decoding on the soft read values. In the event error correction decoding is successful, the decoded information is output (not shown).

In the event error correction decoding is unsuccessful, a decoding fail signal is passed from error correction decoder 102 to read threshold generator 108. This signal is used as a re-read signal and a re-read of solid state storage 150 is performed with a different set of read thresholds and decoding is attempted again with a different set of soft read values.

As described above, in some embodiments, a soft read value is generated using two or more reads of a cell. The following figure describes this technique in further detail.

Figure 2:
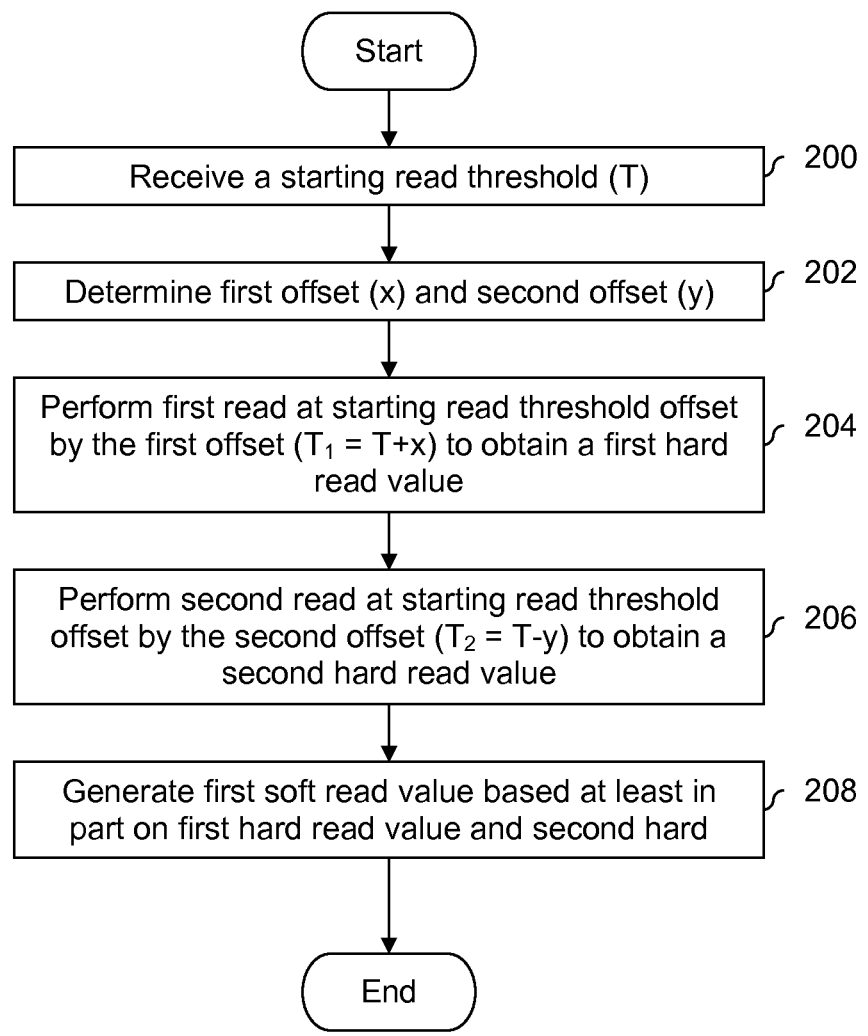
FIG. 2 is a flowchart illustrating an embodiment of a process for determining a soft read value using a plurality of reads at various read thresholds.

FIG. 2 is a flowchart illustrating an embodiment of a process for determining a soft read value using a plurality of reads at various read thresholds. In some embodiments, read processor 100 in FIG. 1 performs the example process shown.

At 200, a read threshold (T) is received. In some embodiments, a read threshold received at 200 is a default and/or stored read threshold. In some embodiments, a read threshold received at 200 is an optimal read threshold (Topt) or an estimate of it.

A first offset (x) and a second offset (y) are determined at 202. In some embodiments, steps 200 and 202 are performed by read threshold generator 108 in FIG. 1. In some embodiments, default and/or stored values are used at 202. In some embodiments, determination of a second offset is performed after a read is performed using the first offset. Some examples for determining a first and a second offset are described in further detail below.

At 204, a first read is performed at the starting read threshold offset by the first offset (e.g., $T_1 = T + x$) to obtain a first hard read value. At 206, a second read is performed at the starting read threshold offset by the second offset (e.g., $T_2 = T - y$) to obtain a second hard read value. In some embodiments, steps 204 and 206 are performed by storage read interface 106 in FIG. 1. It is not necessary for the first (second) read threshold to be to the right (left) of the starting/optimal read threshold; a first read threshold may be to the left of a starting/optimal read threshold and the second read threshold may be to the right.

At 208, a soft read value is generated based at least in part on the first hard read value and the second hard read value. In some embodiments, the soft read value generated at 208 is a first or initial soft read value. In some embodiments, three or more reads are used to generate a soft read value. In one example, if the first and second hard read values are 11, then a LLR with a sign indicating that a 1 is more probable is output. To continue the example, if the first and second hard read values are 00, then a LLR with a sign indicating that a 0 is more probable is output; for all other first and second hard read values (e.g., 01 or 10), some other soft read value with a relatively low certainty is output. Depending upon the bit assignment and the values of the first and second read thresholds, one of those sequences is valid and the other is not. For example, if the first read threshold is lower than the second read threshold and a 1 is associated with lower voltages and a 0 is associated with higher voltages, then the 01 sequence is valid. This doesn't necessarily mean that cells with a reading of 01 are low certainty, it depends on the optimal threshold location. For example, if we estimate the optimal threshold location to be much less than the lowest read threshold, then these cells actually have high certainty because they are well away from the crossover point in the distributions. In some embodiments, step 208 is performed by a soft information generator (e.g., 104 in FIG. 1).

In some embodiments, generating a soft read value at 208 includes tracking which bin a cell falls into. Some embodiments of this are described in further detail below.

In some embodiments, a read processor (e.g., read processor 100 in FIG. 1) is configured to use the process described in FIG. 2 under certain conditions. In some embodiments, performing multiple reads in order to obtain a (e.g., first) soft read value does not incur any reduction in throughput because channel bandwidth is high and/or because of the high level of parallelization utilized for NAND devices. In some embodiments, it is known in advance that an error correction decoder will (probably) not be able to successfully decode a soft codeword which is obtained or generated using only a single read. For example, a read processor may be configured to use the process shown in FIG. 2 if, for some number of last codewords attempted, more than a certain percentage of them were unsuccessfully decoded. Or, it may be known that certain pages or blocks are "bad" because decoding has been difficult in the past for those pages or blocks. Bad locations may be tracked in a table and future reads to those bad pages or blocks may use this technique. In some embodiments, a read processor (e.g., 100 in FIG. 1) is configured to look for one or more of these conditions and if they are found, the read processor switches to the process shown in FIG. 2.

In some embodiments, generating a soft read value at 208 includes differentiating between a 01 and 10 (for example) and outputting different soft read values for those different sequences. For example, in SLC systems where a 1 is associated with the lower voltage range, a 0 is associated with the higher voltage range, the first read is to the right of a starting read threshold, and the second read is to the left of the starting read threshold a first hard read value of 0 and a second hard read value of 1 is unusual. This is because that sequence of hard read values indicates that the voltage stored by that cell has changed by a fairly large amount. This is a strange result and in some embodiments, a soft read value associated with an erasure (e.g., an LLR of 0) is output when this occurs.

In contrast, if the first hard read value is a 1 and the second hard read value is a 0, that sequence of hard read values is neither unusual and/or strange. It merely indicates that the voltage stored by the cell is indeterminate (i.e., between the two read thresholds). The information stored in a cell in this condition (e.g., first hard read value of 1 and the second hard read value of 0) may be of better quality and/or have more useful information than information stored in a cell in the other condition (e.g., first hard read value of 0 and the second hard read value of 1) and so a higher reliability may be desirable. In some embodiments, 11, 00, 10 are referred to as valid read sequences and 01 is referred to as an invalid read sequence. In some embodiments, 11 and 00 are referred to consistent read sequences and 01 and 10 are referred to as inconsistent read sequences.

In some embodiments, solid state storage 150 includes multi-level cells (MLC) where each cell stores two or more bits. Although FIGS. 1 and 2 show SLC examples, the techniques described herein are not limited to SLC embodiments.

Figure 3:
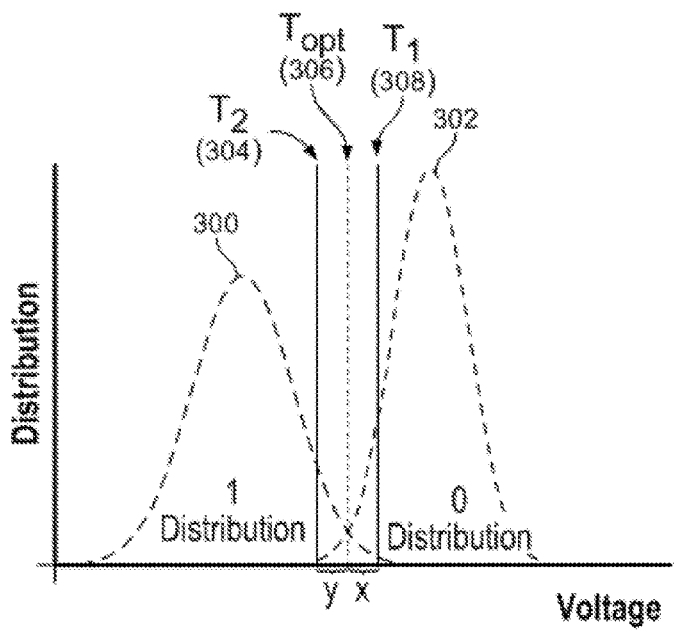
FIG. 3 is a diagram showing an embodiment of a first read threshold and a second read threshold which are offset from an optimal read threshold.

FIG. 3 is a diagram showing an embodiment of a first read threshold and a second read threshold which are offset from an optimal read threshold. In this example, distribution 300 is associated with cells (e.g., in a page) where a 1 was written. Distribution 302 is associated with cells where a 0 was written. Although FIG. 3 and other examples herein show a 1 associated with lower voltage values and a 0 associated with higher voltage values, any assignment of bit values to voltage ranges may be used. Note that when the process of FIG. 2 is performed, neither distribution 300 nor distribution 302 is necessarily known to the read processor performing the example process. Distributions 300 and 302 are shown in FIG. 3 to illustrate their relationship to values 304, 306, and 308.

The optimal read threshold (306) is the voltage at which distribution 300 crosses distribution 302; in some embodiments, a read threshold received at 200 in FIG. 2 is an optimal read threshold (or an estimate of the optimal read threshold). A variety of techniques may be used to estimate or generate $T_{opt}$ 306.

First read threshold 308 ($T_1$) is offset by x to the right of optimal read threshold 306 ($T_{opt}$). Second read threshold 306 ($T_2$) is offset by y to the left of optimal read threshold 306 ($T_{opt}$). In some embodiments, the first read at 308 is analyzed before the second offset y is determined or generated.

Figure 4:
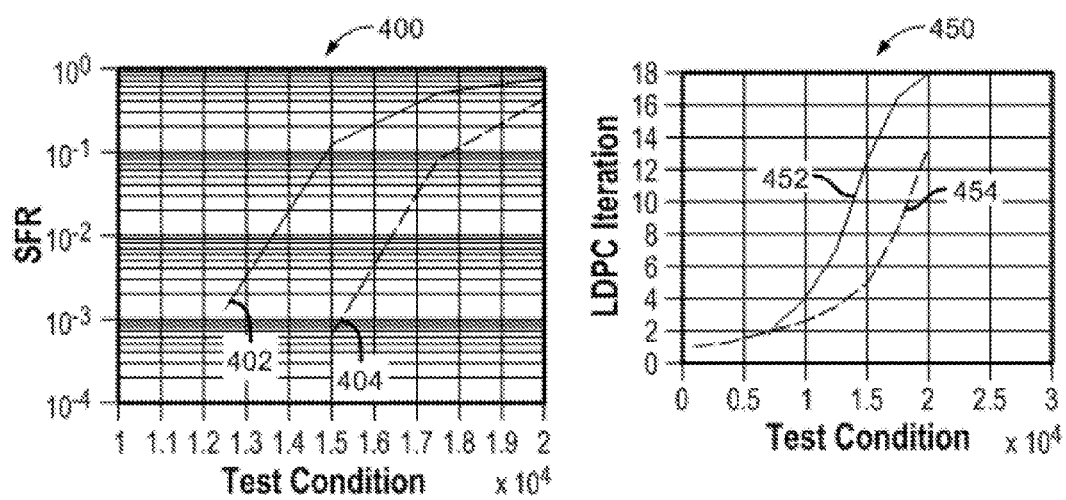
FIG. 4 is a diagram showing an embodiment of performance charts comparing soft read values generated using a variety of techniques.

FIG. 4 is a diagram showing an embodiment of performance charts comparing soft read values generated using a variety of techniques. In the example shown, graph 400 shows sector failure rates (SFR) for two different soft read value generation techniques. In curve 402, the soft read value processed is generated using hard read values obtained from reading at an optimal read threshold and also from reading to the right of the optimal read threshold. Curve 404 is associated with the soft information generation technique described in FIG. 2. In curve 404, the soft read value processed is generated using hard read values obtained from reading to the right of an optimal read threshold and also from reading to the left of the optimal read threshold.

As is shown in graph 400, the SFR of curve 404 is less than that of curve 402. Both techniques associated with curves 402 and 404 use the same number of reads to generate their soft read values, and so the performance difference is due (at least in part) to the greater separation between the first and second reads for curve 404 as compared to curve 402.

Graph 450 shows the average number of LDPC iterations required to process a codeword using the soft read values provided by the two techniques. Curve 452 is associated with the other technique (also related to curve 402) and curve 454 is associated with the technique described in FIG. 2 (also related to curve 404). The technique associated with curve 452 requires more LDPC iterations on average to decode a codeword, indicating that the quality of soft information generated using that technique is worse than those associated with curve 454. Fewer LDPC iterations on average is desirable because less power is consumed, more pages or blocks can be output in the same amount of time, and so on.

Returning to FIG. 2, in some embodiments, techniques are used to determine the first and second offsets at 202 in an intelligent manner. The following figure describes one such embodiment.

FIG. 5 is a diagram showing an embodiment of an offset which is selected based at least in part on the age of data and the age of storage. In some embodiments, the process is used at step 202 in FIG. 2 to determine a first offset and/or a second offset. In solid state storage, information is stored in the form of voltage. Data which has been stored for a longer time tends to lose more voltage than data which has been stored for a shorter time. Also, solid state storage which has been erased many times tends to be more "leaky" (with respect to voltage) than solid state storage which has not been erased as many times. Erasing solid state storage causes the electrical dielectric of the solid state storage to break down. For convenience and brevity, the term "age of storage" is used hereafter but the term is understood to reflect a number of times storage has been erased.

The age of the storage and/or the age of the data may cause distributions (e.g., associated with a specific page or block in storage) to shift and broaden. Graph 550 shows a variety of shifted distributions, each of which is associated with a different amount of voltage leakage. In this example, distributions 552a and 552b are associated with a maximum amount of leakage (e.g., because the data is very old and/or the storage is very old), distributions 554a and 554b are associated with a moderate amount of leakage, distributions 556a and 556b are associated with a minimum amount of leakage, and distributions 558a and 558b are associated with no leakage (e.g., because the data is new and/or the storage is new).

To account for various possible shifted distributions, table 500 is used to select an offset. The top row in table 500 lists a variety of ages of storage (e.g., new storage, somewhat aged storage, old storage, and very old storage) and the leftmost column in table 500 lists a variety of ages of the data stored (e.g., new data, somewhat aged data, old data, and very old data). Based on the age of the storage and the age of the data, the appropriate first offset is selected from table 500. The offset $x_{no\_leakage}$ takes into account the amount of shifting experienced by or contained in distributions 558a and 558b (e.g., so that the offset $x_{no\_leakage}$ would cause a read at $x_{no\_leakage}$ to the right of a starting read threshold to be at a desired position with respect to shifted distribution 558a and/or 558b), the offset $x_{min\_leakage}$ takes into account the amount of shifting in distributions 556a and

556b, the offset $x_{mod\_leakage}$ takes into account the amount of shifting in distributions 554a and 554b, and the offset $x_{max\_leakage}$ takes into account the amount of shifting in distributions 552a and 552b. In this example, $x_{max\_leakage} > x_{mod\_leakage} > x_{min\_leakage} > x_{no\_leakage}$.

In some embodiments, the number of erasures is recorded so that the age of the storage can be determined. In some embodiments, the age of data is known because it is tracked, either by the storage system or by some other entity (e.g., firmware or some other higher-level application). In some embodiments, the age of data is tracked at the page level or (if a more memory efficient technique is desired), on the block level (or superblock level or some other level) and all pages in that block use the same age information.

Returning to step 202 in FIG. 2, in some embodiments, the age of storage and the age of data is used to determine a second offset (y). For example, there may be a table of second offsets similar to table 500. Alternatively, some other technique (one of which is described in further detail below) is used.

Figure 6:
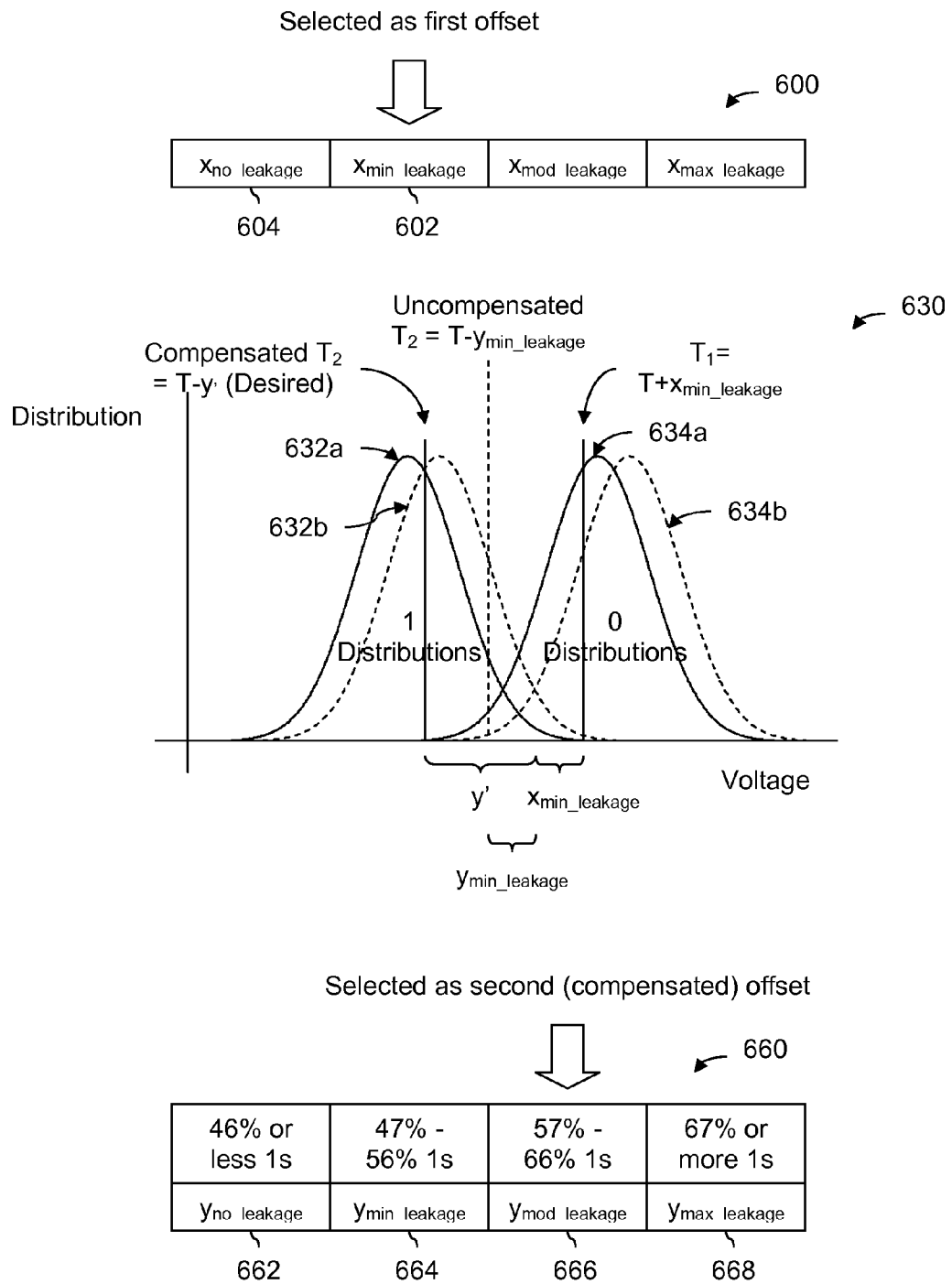
FIG. 6 is a diagram showing an embodiment for selecting a second offset using information from a first read.

FIG. 6 is a diagram showing an embodiment for selecting a second offset using information from a first read. In the example shown, there is a plurality of possible first offsets (600) and one of them (in this example, $x_{min\_leakage}$ 602) is selected to be used as the first offset. In some embodiments, the process used in FIG. 5 is used to select first offset 602.

In diagram 630, a first read is performed at $T+x_{min\_leakage}$ where T is the crossing point of expected distributions 632b and 634b. Expected distributions 632b and 634b (shown with a dashed line) are the distributions which a group of cells (e.g., a page or a block) is expected to have. In actuality, distributions 632a and 634a (shown with a solid line) are the actual distributions for that group of cells. Since the distributions of the group of cells actually follows 632a and 634a (and not 632b and 634b) the first read is actually x' to the right of the crossing point of actual distributions 632a and 634a.

If no compensation is made for the difference between actual distributions 632a and 634a and believed distributions 632b and 634b, then the second read will occur at $T-y_{min\_leakage}$, where T is the crossing point of expected distributions 632b and 634b and $y_{min\_leakage}$ corresponds to $x_{min\_leakage}$ and/or is expected to produce a second read that is symmetric to the first read. Unfortunately, that uncompensated read threshold is very close to the crossing point of actual distributions 632a and 634a and is not symmetric with the first read threshold (with respect to the crossing point of actual distributions 632a and 634a). It may be more desirable to have a second read which is at (or at least closer to) compensated second read threshold $T_2=T-y'$ where T is the crossing point of expected distributions 632b and 634b. Note that the prior expression for a compensated second read threshold is expressed using T; it may be desirable to use the crossing point of expected distributions 632b and 634b since this may correspond to a received starting read threshold (e.g., received at step 200 in FIG. 2) and/or it eliminates the need to determine the crossing point of actual distributions 632a and 634a.

In this example, to obtain a second read at (or at least closer to) the compensated second read threshold shown in 630, a measured percentage of 1s or 0s is compared against an expected percentage. For example, with expected distributions 632b and 634b, a first read at $T_1=T+x_{min\_leakage}$ may correspond to an expected percentage of 52% of 1s and 48% of 0s (the expected percentages are not 50/50 because the first read is slightly to the right of the crossing point of expected distributions 632b and 634b and so slightly more 1s than 0s is expected).

In table 660, each of the possible second offsets is associated with a respective range of measured percentage of 1s. (Although this example uses a percentage of 1s, the technique is not necessarily so limited and some embodiments use percentages of 0s.) If the measured percentage is relatively close to the expected percentage (e.g., within the range of (47%, 56%) of 1s for an expected percentage of 52%), then a second offset which corresponds to the selected first offset is selected (e.g., $y_{min\_leakage}$ in this example). This is because the actual distributions are believed to be fairly similar to the expected distributions when the measured percentage of 1s or 0s is similar to the expected percentage.

A higher than expected percentage of 1s needs to be compensated for with a larger second offset. As such, in table 660, a higher than expected percentage of 1s causes either $y_{mod\_leakage}$ (666) to be selected (in this example, if the measured percentage of 1s is in the range of (57%, 66%)) or $y_{max\_leakage}$ (668) to be selected (in this example, if the measured percentage of 1s is 67% or greater).

A lower than expected percentage of 1s is compensated for with a smaller second offset (not shown in diagram 630). In table 660, a percentage of is less than or equal to 46% would cause $y_{mod\_leakage}$ (666) to be selected.

In this particular example, the measured 60% of 1s causes $y_{mod\_leakage}$ (666) to be selected as the second (compensated) offset; a second read is then be performed at $T-y_{mod\_leakage}$ where T is a starting read threshold (e.g., received at step 200 in FIG. 2). Reading at $T-y_{mod\_leakage}$ (which compensates at least partially for the differences between expected and actual distributions) may provide more useful information than a second read which is at uncompensated second read threshold (e.g., $T-y_{min\_leakage}$).

In some embodiments, table 660 is one a plurality of tables which are prepared ahead of time. For example, a system may store a table (not shown) corresponding to when $x_{no\_leakage}$ 604 is selected as the first offset. Such a table may have 47%-56% of 1s associated with $y_{no\_leakage}$ and other potential second offsets and corresponding percentages. Yet another stored table would correspond to selection of $x_{mod\_leakage}$ 606 as the first offset, and so on.

In some embodiments, a formula, instead of a table, is used to generate or obtain the location of $T_2$. For example, let $R_{1/0}(T_1)$ denote the ratio of 1s to 0s obtained when reading at $T_1$, and let $R_{1/0}(g)$ denote the actual ratio of 1s to 0s in the stored data (this could be stored somewhere). $T_2$ in this example is obtained by using a formula of the form $T_2=\alpha(R_{1/0}(T_1)-R_{1/0}(g))+\beta$ for some predetermined $\alpha$ and $\beta$. This is especially useful when the ideal first read location cannot be obtained due to reasons such as the lack of knowledge of the age of data and age of storage, or $T_1$ being fixed to a certain location. Some soft information generation techniques store all previous hard read values until a codeword is successfully decoded. The following technique describes a memory efficient way for generating soft read values which eliminates the need to store all previous hard read values. This technique is independent of the read technique described above and in some embodiments is used by or with other read techniques.

Figure 7A:
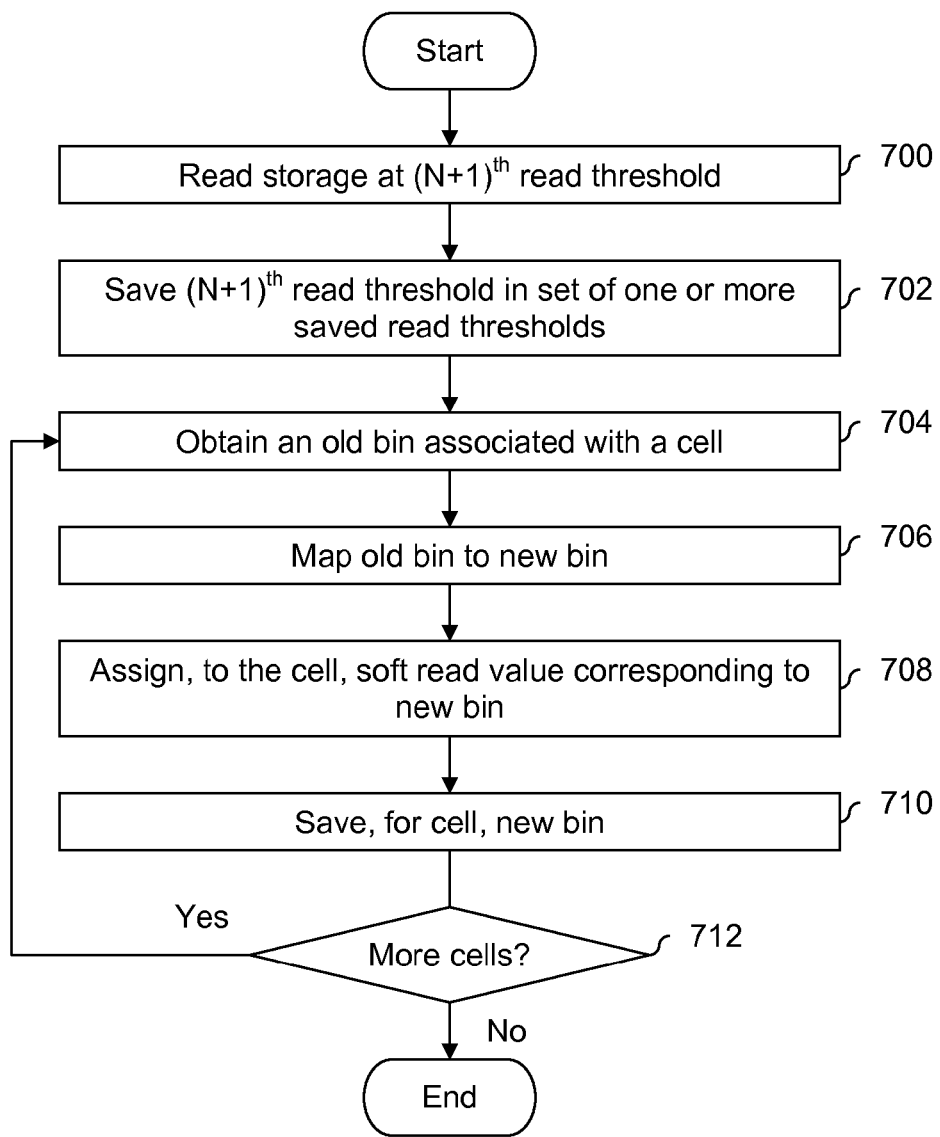
FIG. 7A is a flowchart showing an embodiment of a process for generating soft read values using bins.

FIG. 7A is a flowchart showing an embodiment of a process for generating soft read values using bins. In some embodiments, the process is performed by soft information generator 104 in FIG. 1. The process shown in FIG. 7A may be used with a variety of read techniques, such as techniques for selecting a next read threshold and/or techniques for generating soft read values once given a next read threshold (e.g., on the fly using read back values or beforehand when no actual read back values are used). In some embodiments, FIG. 7A may be repeated as desired, for example each time an error correction decoder fails and/or a new set of one or more soft read values is desired for a set of one or more cells.

At 700, storage is read at an $(N+1)^{th}$ read threshold. In other words, an $(N+1)^{th}$ read is being performed on storage. In some embodiments, step 700 is performed by storage read interface 106 in FIG. 1. Any appropriate technique for selecting or determining a next read threshold may be used. For example, the process shown in FIG. 2 may be used to obtain a first and/or second read threshold.

At 702, the $(N+1)^{th}$ read threshold (also referred to as $x_{N+1}$) is stored in a set of one or more saved read thresholds. These saved read thresholds may be used later to update bin assignments for cells. In some embodiments, read threshold generator 108 in FIG. 1 is configured to store the $(N+1)^{th}$ read threshold for future use by soft information generator 104.

An old bin associated with a cell is obtained at 704 and the old bin is mapped to a new bin at 706. At 708, a soft read value corresponding to the new bin is assigned to the cell. In some embodiments, a soft read value at 708 includes LLR values. For example, the LLR value associated with the bin $B_k^N$ may be given by:

$$LLR_k^N = \log\left(\frac{Pr(\text{cell} = 0 \mid \text{cell} \in B_k^N)}{Pr(\text{cell} = 1 \mid \text{cell} \in B_k^N)}\right). \quad (1)$$

In some embodiments, step 708 includes calculating soft read values on the fly, for example based on the most recent hard read value for that cell and/or one or more previous hard read values for that cell. In some embodiments, step 708 includes using one or more stored tables. For example, a system may keep a set of stored tables, each table of which is associated with a different number of reads or bins. These tables may be prepared and stored ahead of time (e.g., before any reads are performed). Some examples of steps 704, 706, and 708 are described in further detail below.

At 710, the new bin for a cell is saved. In some embodiments, a stored new bin is used at a next iteration (e.g., at 704) in the event error correction decoding fails and/or another soft read value is desired for that cell. It is determined at 712 if there are more cells. If so, an old bin identifier associated with a next cell is obtained at 704. If not, the process ends. In some embodiments, steps 704, 706, 708, and 710 are performed by soft information generator 104 in FIG. 1.

Figure 7B:
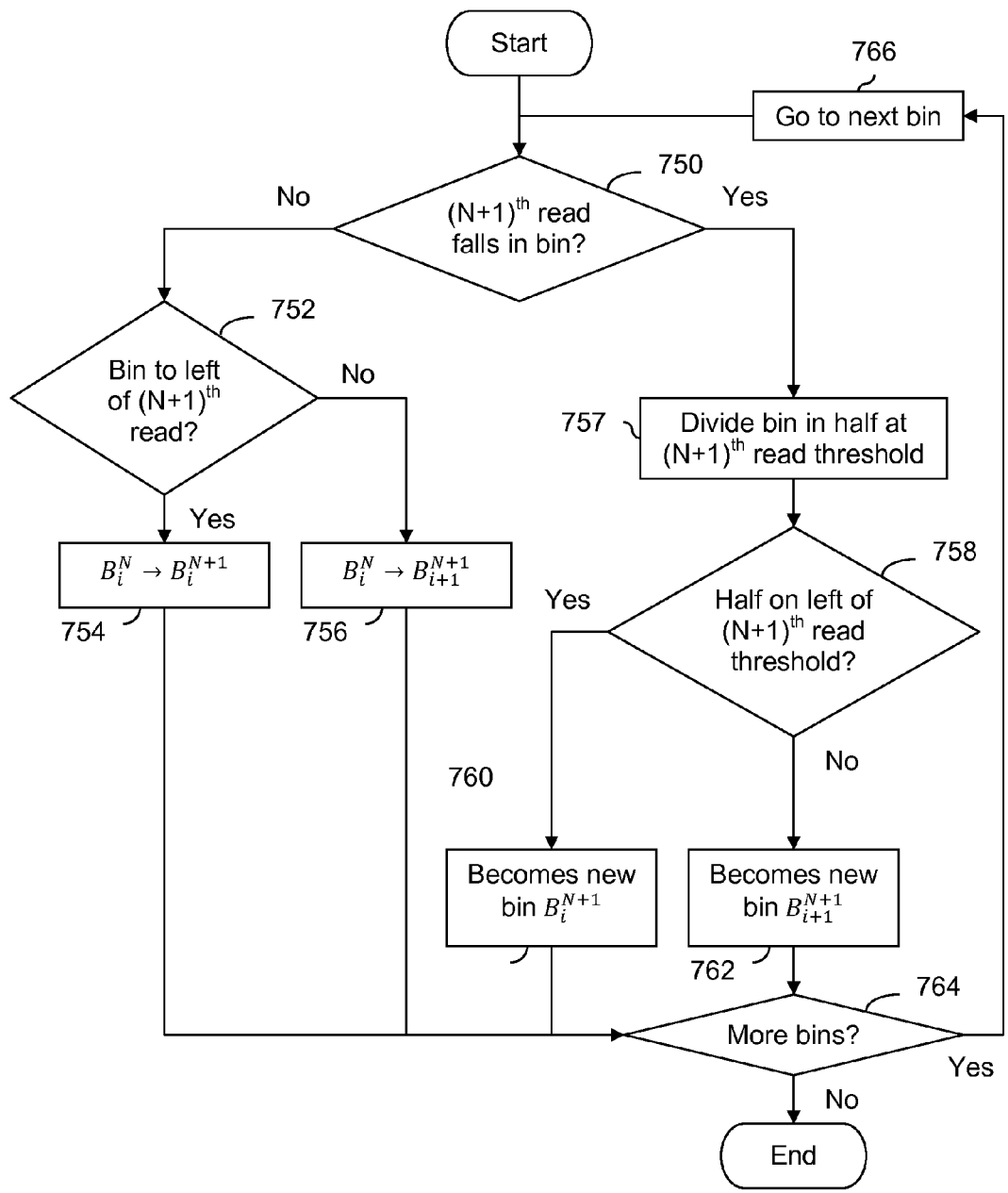
FIG. 7B is a flowchart illustrating a SLC embodiment of a process for mapping an old bin to a new bin.

FIG. 7B is a flowchart illustrating a SLC embodiment of a process for mapping an old bin to a new bin. In some embodiments, step 706 in FIG. 7A uses the process of FIG. 7B. At 750, it is determined if a $(N+1)^{th}$ read falls in a given bin. One and only one of a plurality of adjacent but non-overlapping bins is split by the $(N+1)^{th}$ read. If the bin is not the one split by the $(N+1)^{th}$ read, then it is determined at 752 if the bin is to the left of the $(N+1)^{th}$ read. If so, bin $B_i^N$ (that is, the $i^{th}$ bin after the $N^{th}$ read) is mapped to $B_i^{N+1}$ (that is, the $i^{th}$ bin after the $(N+1)^{th}$ read) at 754. If not, bin $B_i^N$ is mapped to $B_{i+1}^{N+1}$ at 756. Note that the mappings at 754 and 756 preserve the bin boundaries, even if a bin number or bin index (i.e., the x term in $B_x^y$) changes. In other words, those bins are mapped to new bins which preserve the left and right bin boundaries.

If the $(N+1)^{th}$ read does fall in a given bin at 750, the bin is divided in half at the $(N+1)^{th}$ read threshold at 757. It is determined at 758 if it is the half on the left of the $(N+1)^{th}$ read threshold. If so, it becomes new bin $B_i^{N+1}$ at 760. If not (that is, it is to the right of the $(N+1)^{th}$ read threshold), then it becomes the new bin $B_{i+1}^{N+1}$ at 762. In other words, the bin in which the $(N+1)^{th}$ read falls is split in two at the $(N+1)^{th}$ read threshold.

It is determined at 764 if there are more bins. If so, the process goes to the next bin at 766 and it is determined at 750 if the $(N+1)^{th}$ read falls in that bin.

Figure 8:
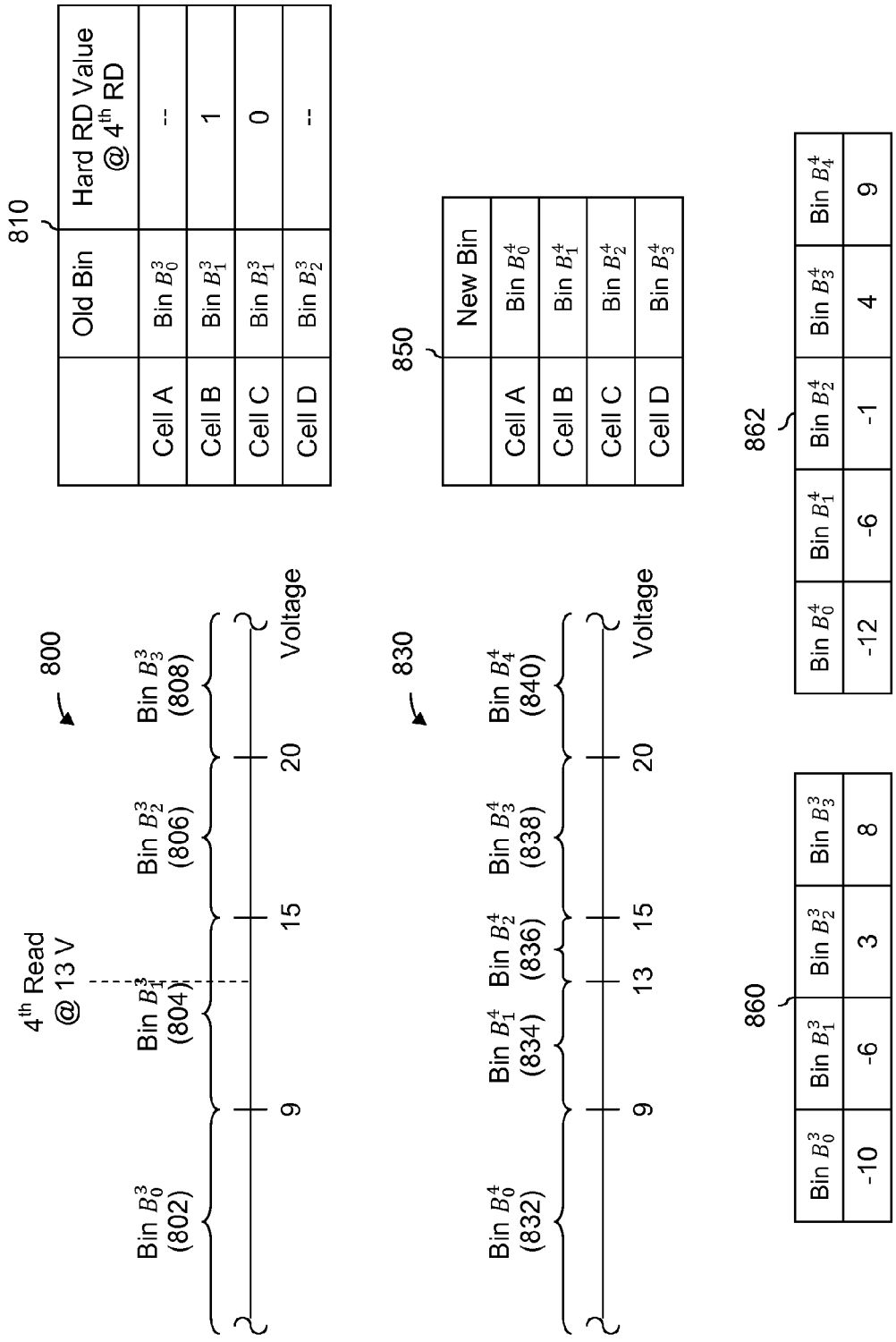
FIG. 8 is a diagram showing an embodiment of old bins which are mapped to new bins.

FIG. 8 is a diagram showing an embodiment of old bins which are mapped to new bins. In FIG. 8, the bin mapping shown in FIG. 7B is used. Diagram 800 shows a set of bins prior to a $4^{th}$ read. Bin $B_0^3$ (802) has a range of $(-\infty, 9)$, bin $B_1^3$ (804) has a range of $[9,15)$, bin $B_2^3$ (806) has a range of $[15,20)$, and bin $B_3^3$ (808) has a range of $[20,\infty)$. Each of the cells in a group (e.g., a page of cells) falls into one of the bins, but the system does not necessarily track or record what specific voltage a given cell has. The values (e.g., read thresholds, bin ranges, numbers of reads, etc.) used herein are merely exemplary and are not intended to be limiting.

A more general way of expressing bins and their boundaries is:

$$B_0^N = (-\infty, x_1) \quad (2)$$
$$B_1^N = [x_1, x_2)$$
$$\vdots$$
$$B_N^N = [x_N, \infty).$$

where $(x_1, x_2, \ldots, x_N)$ are the first N read thresholds sorted in ascending order (e.g., $x_1 < x_2 < \ldots < x_N$). The reads are not necessarily performed in that order.

Table 810 shows old bins (e.g., prior to the $4^{th}$ read) and hard read values from a $4^{th}$ read for cells A-D. Cell A is in bin $B_0^3$ (802), cells B and C are in bin $B_1^3$, and cell D is in bin $B_2^3$. Since the $4^{th}$ read falls into bin $B_1^3$, the hard read values for cells B and C are used to determine whether a cell falls in the left portion or right portion of old bin $B_1^3$. This information is not needed for cells in other bins and is therefore not shown in table 810 for cells A and D.

Diagram 830 shows the new bins and their ranges after the $4^{th}$ read: bin $B_0^4$ (832) has a range of $(-\infty,9)$, bin $B_1^4$ (834) has a range of $[9,13)$, bin $B_2^4$ (836) has a range of $[13,15)$, bin $B_3^4$ (838) has a range of $[15,20)$, and bin $B_4^4$ (840) has a range of $[20,\infty)$.

Table 850 shows the new bins associated with cells A-D. Neither bin $B_0^3$ (which cell A falls into) nor bin $B_2^3$ (which cell D falls into) is split by the $4^{th}$ read. Cells B and C are, however, in the bin which is split by the $4^{th}$ read. Since cell B is to the left of the read and cell C is to the right of the read based on the bit mapping described above, cell B is assigned to bin $B_1^4$ and cell C is assigned to $B_2^4$.

A more formal expression of this mapping from old bin to new bin is:

$$B_0^{N+1} \quad (3)$$
$$B_1^{N+1}$$

-continued $$B_s^N \to \begin{cases} B_s^{N+1} & \text{if cell} < y \\ B_{s+1}^{N+1} & \text{if cell} \geq y \end{cases}$$

$$\to B_N^{N+1}$$

$$B_{N+1}^{N+1}$$

where $B_i^j$ is the $i^{th}$ bin (counting from left to right in this example) after the $j^{th}$ read and y is the $(N+1)^{th}$ read threshold (e.g., 13V in diagram 800).

In this example, the system stores a set of tables, each table of which is associated with a certain number of reads or bins. Table 860 is associated with 4 bins (i.e., 3 reads) and table 862 is associated with 5 bins (i.e., 4 reads). The table with the appropriate number of bins/reads is selected depending upon what iteration or read a system is at. Using table 862, cells A-D are assigned soft read values after the $4^{th}$ read of −−12, −6, −1, and 4, respectively.

In this example, tables 860 and 862 are not tied to any specific bin range or boundary. For example, a system would use table 860 both for bin ranges of (−∞,1), [1,3), [3,5), and [5,∞), as well as for bin ranges of (−∞,9), [9,15), [15,20), and [20,∞). In some embodiments, using a table to generate a soft read value is desirable because it is faster and/or computationally easier than calculating a soft read value on the fly. For example, some other techniques require storage of all previous (e.g., N) hard read values for a given cell in order to generate a soft read value for that cell. If a page which includes 4 k cells is being processed and 10 reads have already been performed, then this would require storing 40 k bits. Using all previous hard read values for a cell does not necessarily produce a soft read value of good enough quality to warrant the additional storage and/or processing required. Using pre-calculated LLR values stored in tables associated with a given number of bins or reads (but which are not limited to specific bin ranges or boundaries) may produce similar or sufficient quality results without requiring as much storage and/or processing.

In some embodiments, bin assignment is tracked and/or managed in a system using a bin identifier (e.g., the lower right index of the bin). In some embodiments, bin assignment is tracked and/or managed using the soft read values themselves. For example, the old bin column in table 810 would be −10, −6, −6, and 3 in such embodiments and the new bin column in table 850 would be −12, −6, −1, and 4.

Although using bin identifiers may require less storage than using the soft read values themselves for tracking bin assignments, there are some benefits to using the latter technique to track bin assignment. For example, if updated LLRs need to be stored for whatever reason, tracking bin assignment using the soft read values themselves may be desirable, since using bin numbers to track would require storage of both the bin numbers and the LLRs which is redundant. In one example scenario, if a system is servicing read requests for different pages simultaneously but there is only one decoder (e.g., error correction decoder 102 in FIG. 1), an LLR update process (e.g., soft information generator 104 in FIG. 1) can be run first to obtain updated LLRs for the different pages while waiting for the decoder to free up. This increases system throughput, but the updated LLRs need to be stored until they can be passed to the decoder, which makes tracking bin assignment using the LLR values themselves attractive. As this example shows, system configuration (such as selection of how a system tracks information) depends on system requirements, design constraints, and/or any tradeoffs.

In some embodiments, bins are merged as soft read values are iteratively or repeatedly generated. In some embodiments, adjacent bins that are relatively far from a distribution crossing point are merged. Merging such bins may reduce the amount of information that needs to be stored, yet performance (e.g., as measured by error rates or error correction decoder iterations) degradation is negligible as the system is insensitive to small changes in LLR values for bins that are too far away from the crossing point. In some embodiments, a system saves all read thresholds and so the system knows where the bin boundaries are and which bins can be merged. In some embodiments, bin merging is performed during mapping of an old bin identifier to a new bin identifier (e.g., at 706 in FIG. 7A) so that bin merging is performed "gracefully" at a time that will not put an error correction decoder or other component into an undesirable state.

In some embodiments, it is possible for adjacent bins to be assigned identical LLRs, thus merging those bins may eliminate redundancy and reduce storage bandwidth. This is, for example, an issue for fixed point systems where quantization and/or saturation needs to be taken into consideration. In some embodiments, bin merging is permitted and/or acceptable if the affected bins are relatively far from a distribution crossing point. In some embodiments, a window around a starting read threshold (e.g., received at step 200 in FIG. 2) and/or an optimal read threshold or an estimate therefore (e.g., $T_{opt}$ 306 in FIG. 3) is used to define a region over which bins are not permitted to be merged. In some embodiments, one or more LLR values are shifted up/down to create enough unique LLR values to prevent bins from merging (e.g., as a result of quantization and/or saturation).

In some embodiments, a system is a MLC system and the process described in FIG. 7A is applied to an MLC system. The following figures describe some MLC embodiments where soft read values are generated using bins.

Figure 9:
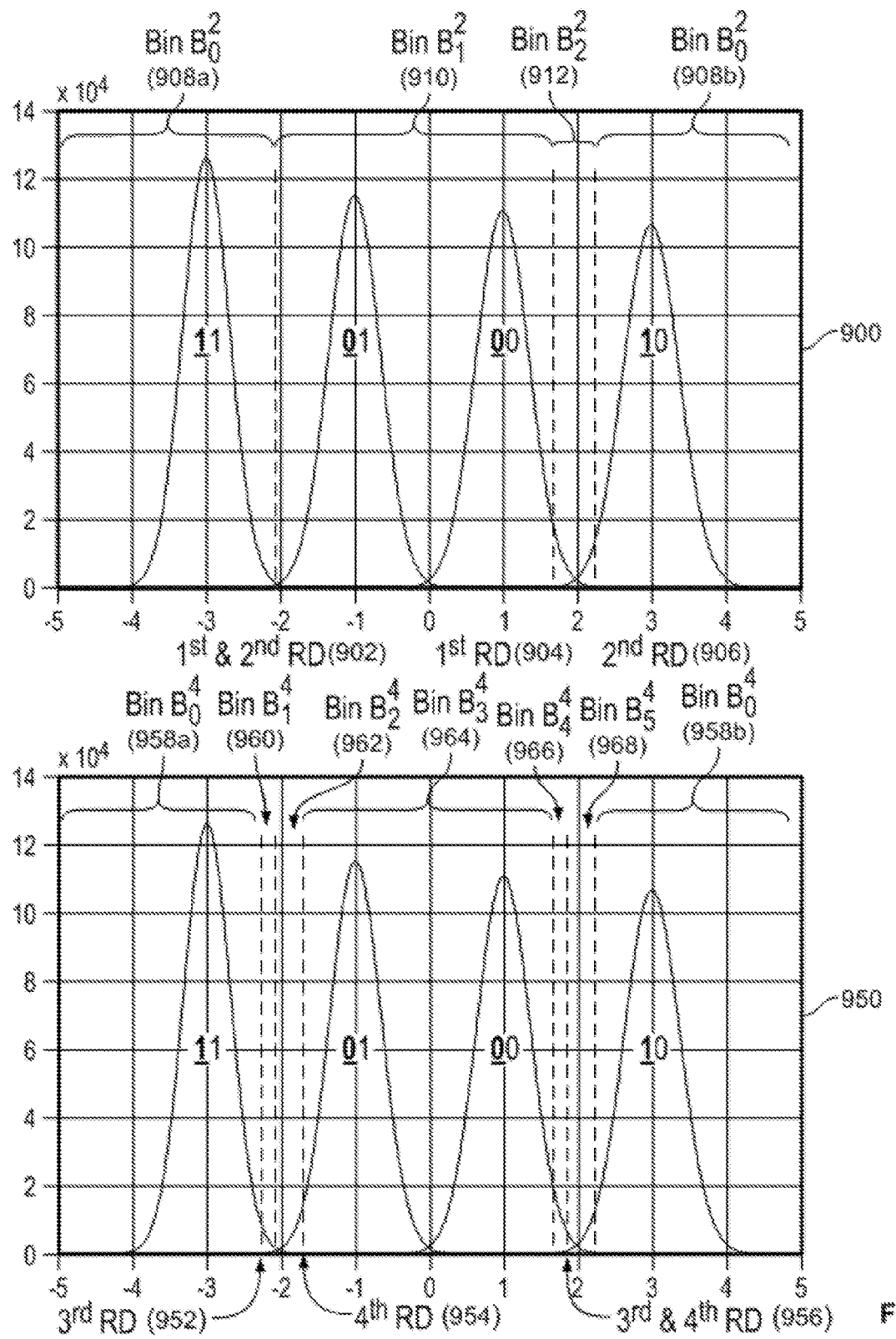
FIG. 9 is a diagram showing a 2-bit MLC embodiment where one threshold is fixed while the other is permitted to vary.

FIG. 9 is a diagram showing a 2-bit MLC embodiment where one threshold is fixed while the other is permitted to vary. In the example shown, bit values are (from left to right) 11, 01, 00, and 10. The examples described in this figure and other figures are not intended to be limiting and the techniques described herein may be used with other bit mappings/assignments and/or 3-bit (i.e., triple-level cell (TLC)) or larger systems. To generate a soft read value for the least significant bit (LSB), the process described above with SLC examples may be used (e.g., reads would occur mostly around the crossing point of the 01 and 00 distributions). In this example, to generate a soft read value for the most significant bit (MSB), one MSB threshold is held fixed while the other is permitted to vary.

In diagram 900, a left MSB read threshold is held fixed while the right MSB threshold is permitted to vary. In this example, the left MSB threshold (which is fixed, at least during diagram 900) is set to a value for the first that is close to the crossing point of the 11 and 01 distributions (e.g., to maximize the probability of successful decoding).

While the left MSB read threshold is held fixed at first and second read thresholds 902, the right MSB read threshold is permitted to vary. As such, the right MSB read threshold at the first read (904) does not equal the right MSB read threshold at the second read (906). In this particular example, the two right MSB read thresholds 904 and 906 are near the crossing point of the 00 and 10 distributions.

Together, read thresholds 902, 904, and 906 define the following bins: bin $B_0^2$ which includes portion 908a as well as portion 908b, bin $B_1^2$ (910) between the left MSB read threshold (902) and the right MSB read threshold at the first read (904), and bin $B_2^2$ (912) between the right MSB read threshold at the first read (904) and the right MSB read threshold at the second read (906). Portions 908a and 908b comprise the same bin because they both are associated with MSB values of 1.

Between diagrams 900 and 950, a soft read value is output for the MSB using the bins shown in diagram 900. If error correction decoding is unsuccessful, one or more additional reads are performed where the right MSB read threshold is held fixed and the left MSB read threshold is permitted to vary.

In diagram 950, the right MSB read threshold is held fixed while the left MSB read threshold is permitted to vary. Diagram 950 shows where the third and fourth reads are performed and the resulting bins. As in diagram 900, the right MSB read threshold (now fixed in diagram 950) is fixed at a voltage close to the crossing point of the 00 and 10 distributions. The left MSB read threshold is permitted to vary and the third read threshold (952) does not match the fourth read threshold (954); both are in the vicinity of the crossing point of the 11 and 01 distributions.

The seven bins in diagram 950 are defined by the previous reads. Bin $B_0^4$ includes portion 958a and portion 58b, bin $B_1^4$ (960) is between the left MSB read threshold at the third read (952) and the left MSB read threshold at the first and second read (902), bin $B_2^4$ (962) is between voltage 952 and the left MSB read threshold at the $4^{th}$ fourth read (954), bin $B_3^4$ (964) is between voltage 954 and the right MSB read threshold at the first read (904), bin $B_4^4$ (966) is between voltage 904 and the right MSB read threshold at the third and fourth read (956), and bin $B_5^4$ (968) is between voltage 956 and the right MSB read threshold at the second read (906). Since portions 958a and 958b are both associated with MSB values of 1, they are included in the same bin (i.e., bin $B_0^4$).

The bins shown in diagram 950 are then used to assign soft read values (e.g., LLR values) to the MSB (e.g., by accessing a stored table of LLR values and assigning them to cells in the respective bins). Note that although the 01 and 00 distributions are both in bin 3 (964), this is acceptable since both distributions are associated with MSB values of 0 and the process is generating soft read values for the MSB.

In some embodiments, the LSB of a cell has been correctly read. The following figure describes a technique in which knowledge of the LSB is leveraged to generate a soft read value for the MSB.

Figure 10:
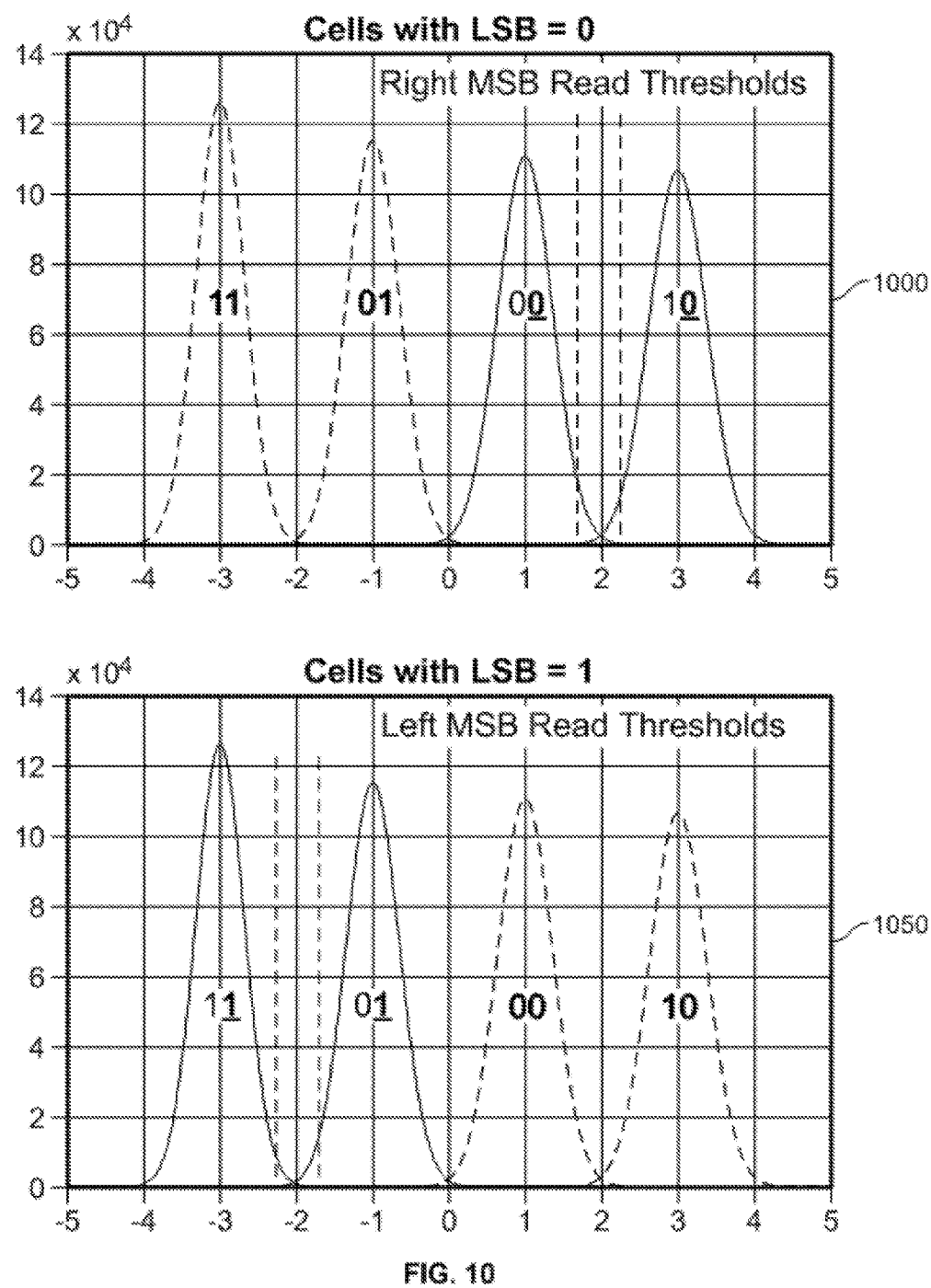
FIG. 10 is a diagram showing a 2-bit MLC embodiment of distributions where the LSB is known.

FIG. 10 is a diagram showing a 2-bit MLC embodiment of distributions where the LSB is known. As in the previous example, FIG. 7A may be used to generate soft information for the LSB and the techniques described herein relate to generating a soft read value for the MSB. In the example shown, the LSB of each cell is known. Cells with an LSB of 0 have the distributions shown in diagram 1000. Since cells with an LSB of 1 have been excluded from graph 1000, the 11 and 01 distributions are zeroed out and are shown with a dashed line.

Similarly, diagram 1050 is associated only with cells which have an LSB of 1. Since cells with an LSB of 0 have been excluded from that group, distributions 00 and 10 have been zeroed out and are shown with a dashed line.

In this example the left MSB read threshold is varied near the crossing point of the 11 and 01 distribution and the right MSB read threshold is varied near the crossing point of the 00 and 10 distribution. By varying the left and right MSB read thresholds simultaneously, fewer reads from solid state storage are required. For example, the left and right MSB read thresholds are set to a first value and a first read is performed using those voltages. Cells which have an LSB of 0 are assigned to one of two bins based on whether the hard read values are 0 or 1. Similarly, cells which have an LSB of 1 are assigned to one of two bins based on whether the hard read values are 0 or 1, where this set of two bins are different from the previously defined two bins. If decoding fails, a second read is performed where both the right and left MSB read thresholds are varied from their first values. The right MSB threshold splits one of the two bins that correspond to LSB of 0, while the left MSB threshold splits one of the two bins that correspond to LSB of 1. Based on hard read values of the $2^{nd}$ read, cells are assigned to the left or right side of the bins that are split. This process is repeated until decoding is successful. In essence, this technique is equivalent to running two independent SLC bin mapping processes (see FIG. 7B) simultaneously. Compared to the technique described in FIG. 9, this technique requires half as many reads from storage.

Although the MSB techniques described above are useful for some applications, they may not be attractive for all applications. The following figures describe a technique which does not require as many reads from storage as in FIG. 9, nor is knowledge of the LSB required as in FIG. 10.

Figure 11A:
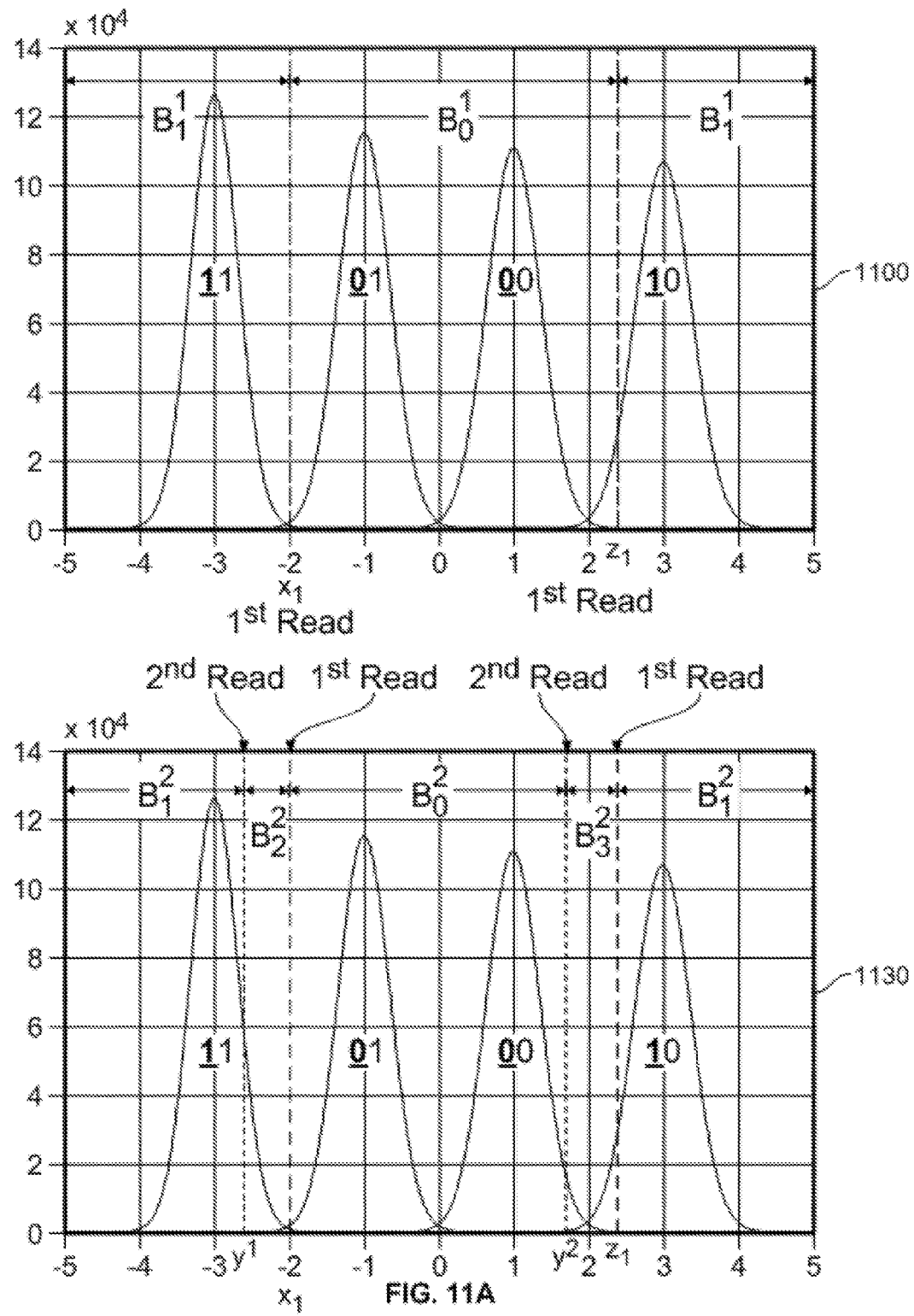
FIG. 11A is a diagram showing a 2-bit MLC embodiment of first and second values for a right and left MSB read threshold.

FIG. 11A is a diagram showing a 2-bit MLC embodiment of first and second values for a right and left MSB read threshold. In this example, there is no knowledge of the value of the LSB for a given cell. The technique described herein relates to determining a soft read value using bins for the MSB of a multi-level cell; some other technique (e.g., FIG. 7A) may be used to determine a soft read value for the LSB.

Let $x_N = (x_1, x_2, \ldots, x_N)$ and $z_N = (z_1, z_2, \ldots, z_N)$ respectively be the N previous left MSB read thresholds and N previous right MSB read thresholds when sorted in ascending order. In other words, the sequence of reads for the left MSB read threshold (as an example) is not necessarily $x_1$, $x_2$, and so on.

Also, let $y^1$ and $y^2$ be the $(N+1)^{th}$ value of the left MSB read threshold and the right MSB read threshold, respectively. As in the example of FIG. 7A, the $(N+1)^{th}$ value of the left and right MSB read threshold will split two (i.e., different) bins in half. These two bins in which the reads fall are called $B_s^N$ (split by the left MSB read threshold) and $B_q^N$ (split by the right MSB read threshold). Cells in bins which are split at the $(N+1)^{th}$ read are mapped to a new bin as follows:

$$B_s^N \to \begin{cases} B_s^{N+1} & \text{if cell} < y^1 \\ B_{2N}^{N+1} & \text{if cell} \geq y^1 \end{cases} \quad (4)$$

$$\vdots$$

$$B_q^N \to \begin{cases} B_q^{N+1} & \text{if cell} < y^2 \\ B_{2N+1}^{N+1} & \text{if cell} \geq y^2 \end{cases}.$$

For all other bins which are not split by the right or left MSB read threshold, $B_i^N \to B_i^{N+1}$.

Diagram 1100 shows the bins created by a first read. Note that although there are 3 "regions" there are actually only two bins since the region to the left of the first, left MSB read threshold and the region to the right of the first, right MSB read threshold are the same bin (i.e., $B_1^1$). This is because both of those regions associated with bin $B_1^1$ are associated with an MSB of 1 and technique described herein relates to generating a soft read value for the MSB, not the LSB.

Diagram 1130 shows the bins created by a second read. The second, left MSB read threshold has divided the left bin $B_1^1$ into bins $B_1^2$ and $B_2^1$. The second, right MSB read threshold has divided bin $B_0^1$ into bins $B_0^2$ and $B_3^2$. The right $B_1^1$ was not split by either read and becomes $B_1^2$.

Figure 11B:
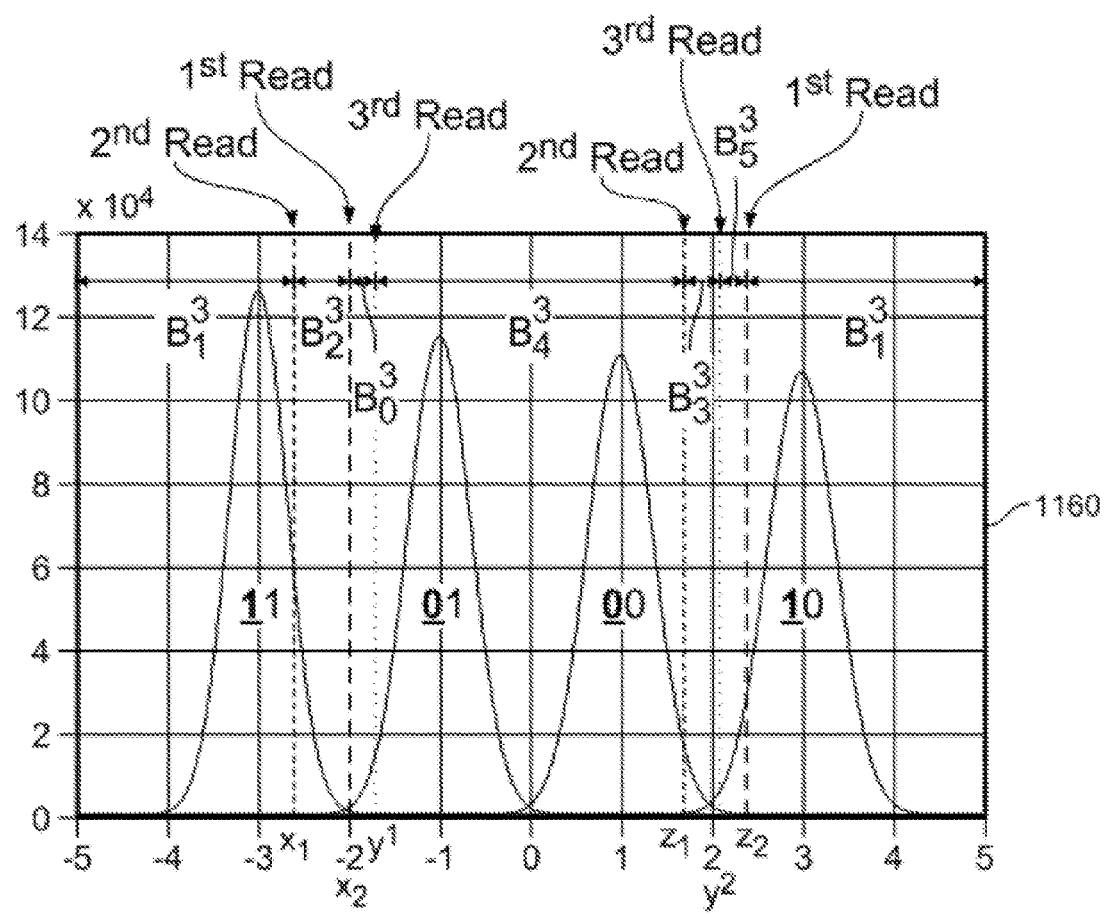
FIG. 11B is a diagram showing an embodiment of third values for a right and left MSB read threshold.

FIG. 11B is a diagram showing an embodiment of third values for a right and left MSB read threshold. FIG. 11B continues the example of FIG. 11A. In this example, the third, left MSB read threshold has split bin $B_0^2$ into bins $B_0^3$ and $B_4^3$. This reflects the mapping of $$B_s^N \to \begin{cases} B_s^{N+1} & \text{if cell} < y^1 \\ B_{2N}^{N+1} & \text{if cell} \geq y^1 \end{cases}.$$

The third, right MSB read threshold has split bin $B_3^2$ into bins $B_3^3$ and $B_5^3$. This refledts the mapping of $$B_q^N \to \begin{cases} B_q^{N+1} & \text{if cell} < y^2 \\ B_{2N+1}^{N+1} & \text{if cell} \geq y^2 \end{cases}.$$

Returning to FIG. 7A, it is apparent that the process of FIG. 7A follows the bin splitting shown in FIGS. 11A and 11B for the MSB. As shown, FIG. 7A applies to (at the very least) SLC systems and both the MSB and LSB of 2-bit MLC systems.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for generating a soft read value, comprising:
 a storage read interface configured to read at a read threshold; and
 a soft information generator configured to:
 obtain an old bin associated with a cell;
 map the old bin to a new bin; and
 assign, to the cell, a soft read value corresponding to the new bin.

2. The system of claim 1, wherein the system includes a semiconductor device, including one or more of the following: an application-specific integrated circuit (ASIC) or a field-programmable gate array (FPGA).

3. The system of claim 1 further comprising solid state storage, wherein the storage read interface is configured to read the solid state storage.

4. The system of claim 1, wherein the soft information generator is configured to map by:
 determining if the read threshold falls in a given bin; and
 in the event the read threshold falls in the given bin, dividing the given bin in half at the read threshold.

5. The system of claim 4, wherein the soft information generator is further configured to map by: in the event the read threshold does not fall in the given bin, mapping the given bin to a new bin that preserves the left bin boundary and the right bin boundary of the given bin.

6. The system of claim 1, wherein the storage read interface is configured to read a single level cell (SLC) storage.

7. The system of claim 1, wherein the storage read interface is configured to read a multi-level cell (MLC) storage.

8. The system of claim 7 further comprising a read threshold generator configured to generate a left most significant bit (MSB) read threshold and a right MSB read threshold, wherein the read threshold generator is configured to:
 during a first read period, hold the left MSB read threshold fixed and permit the right MSB read threshold to vary; and
 during a second read period, permit the left MSB read threshold to vary and hold the right MSB read threshold fixed.

9. The system of claim 7 further comprising a read threshold generator configured to generate a left most significant bit (MSB) read threshold and a right MSB read threshold, wherein the read threshold generator is configured to let the left MSB read threshold and the right MSB read threshold simultaneously vary.

10. A method for generating a soft read value, comprising:
 using a storage read interface to read at a read threshold;
 obtaining an old bin associated with a cell;
 using a soft information generator to map the old bin to a new bin; and
 using the soft information generator to assign, to the cell, a soft read value corresponding to the new bin.

* * * * *